United States Patent
Kitano et al.

(10) Patent No.: US 6,773,510 B2
(45) Date of Patent: Aug. 10, 2004

(54) SUBSTRATE PROCESSING UNIT

(75) Inventors: Takahiro Kitano, Kumamoto (JP);
Shinichi Sugimoto, Kumamoto (JP);
Shinji Kobayashi, Kumamoto (JP);
Naoya Hirakawa, Kumamoto (JP);
Akira Fukutomi, Kumamoto (JP);
Nobukazu Ishizaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 129 days.

(21) Appl. No.: 10/122,389

(22) Filed: Apr. 16, 2002

(65) Prior Publication Data

US 2002/0148566 A1 Oct. 17, 2002

(30) Foreign Application Priority Data

Apr. 17, 2001 (JP) ........................................ 2001-118738

(51) Int. Cl.⁷ ........................... B05C 11/02; B05C 13/02
(52) U.S. Cl. ...................... 118/52; 118/320; 118/326; 118/50; 427/240; 427/425; 438/760
(58) Field of Search ...................... 118/52, 50, 320, 118/326, 56, 58, 64; 438/760; 396/604, 611; 427/240, 335, 350, 372.2, 378, 425

(56) References Cited

U.S. PATENT DOCUMENTS

| | | | | |
|---|---|---|---|---|
| 5,718,763 A | * | 2/1998 | Tateyama et al. | 118/52 |
| 5,879,457 A | * | 3/1999 | Sahoda et al. | 118/319 |
| 6,159,541 A | * | 12/2000 | Sakai et al. | 427/240 |
| 6,221,782 B1 | * | 4/2001 | Shan et al. | 438/710 |
| 6,306,455 B1 | * | 10/2001 | Takamori et al. | 427/8 |
| 6,415,736 B1 | * | 7/2002 | Hao et al. | 118/723 E |

* cited by examiner

*Primary Examiner*—Richard Crispino
*Assistant Examiner*—Michelle Acevedo Lazor
(74) *Attorney, Agent, or Firm*—Oblon, Spivak, McClelland, Maier & Neustadt, P.C.

(57) ABSTRACT

The present invention relates to a processing unit for processing a substrate, which comprises a chamber for housing the substrate and forming a hermetically closeable processing room, and an exhauster for exhausting an atmosphere in the processing room from an upper portion of the chamber to reduce a pressure in the processing room. The processing unit of the present invention includes a current plate for controlling an atmospheric current formed in the processing room when the pressure is reduced, and the chamber has a mounting table for mounting the substrate thereon, an almost cylindrical lid body with its lower face open for covering the substrate on the mounting plate from above and forming the processing room integrally with the mounting table, and a supporting member for supporting the current plate so that the current plate is parallel to the mounting plate. According to the present invention, the speed of an atmospheric current flowing between the current plate and the substrate becomes uniform within the surface of the substrate, and consequently when a coating film on the substrate is dried, the film is planarized to have a uniform thickness.

17 Claims, 15 Drawing Sheets

SUBSTRATE PROCESSING UNIT

BACKGROUND OF THE INVENTION

1. Field of the Invention

The present invention relates to a substrate processing unit.

2. Description of the Related Art

In a photolithography process in semiconductor device fabrication processes, for example, resist coating treatment for coating the surface of a wafer with a resist solution to form a resist film on the wafer, exposure processing for exposing the wafer in a pattern, developing treatment for developing the exposed wafer, and the like are performed to form a predetermined circuit pattern on the wafer.

At present, in the aforementioned resist coating treatment, a spin coating method in which the resist solution is discharged to the center of the wafer which is being rotated and spread over the surface of the wafer is in the mainstream.

In the spin coating method, however, since the wafer is rotated at high speed, a large quantity of resist solution is scattered from an outer edge portion of the wafer, and hence a lot of resist solution is wasted. Moreover, a unit used in this method is contaminated by the scattering of the resist solution, which causes a disadvantage that the unit needs to be cleaned frequently, or the like.

Therefore, in place of the spin coating method in which the wafer is rotated, a so-called one-stroke sketch coating method, in which the resist solution is discharge onto the wafer while the wafer and a resist solution discharge nozzle move relative to each other so that the track of a resist solution discharger has a large rectangular wave shape with large amplitude, and as a result, the resist solution is applied all over the wafer in the form of parallel lines, is thought out. In the case of this one-stroke sketch coating method, there is a possibility that the surface of a resist film after coating swells along a path of application of the resist solution, and therefore it is thought that the use of a resist solution with a low viscosity which spreads easily over the wafer after application is preferable.

However, even if the resist coating is performed by the use of the resist solution with the low viscosity, it is still expected that the surface of the resist solution swells along the path of application of the resist solution, and hence processing to planarize the resist film is required after coating. Therefore, it can be proposed that the wafer coated with the resist solution is housed in a chamber, a pressure in the chamber is reduced while an atmosphere therein is exhausted, and that by an atmospheric current formed on this occasion, the resist film is planarized.

To planarize a resist film by an atmospheric current as in such a proposal, it is desirable to attach a current plate so that the atmospheric current flows along the surface of the resist film. In this case, if a uniform atmospheric current is not formed over the entire surface of the wafer, the resist film is not planarized uniformly within the surface of the wafer, and hence the thickness of the resist film becomes nonuniform. Accordingly, it is important to form the uniform atmospheric current on the wafer within the surface of the wafer when the current plate is used.

SUMMARY OF THE INVENTION

The present invention is made in view of the aforesaid point, and its object is to make an atmospheric current generated by a reduction in pressure uniform on the surface of a substrate such as a wafer.

In view of this object, the present invention is a processing unit for processing a substrate, comprising: a chamber for housing the substrate and forming a hermetically closeable processing room; an exhauster for exhausting an atmosphere in the processing room from an upper portion of the chamber to reduce a pressure in the processing room; and a current plate for controlling an atmospheric current formed in the processing room when the pressure is reduced. The chamber includes a mounting table for mounting the substrate thereon, an almost cylindrical lid body with its lower face open for covering the substrate on the mounting plate from above and forming the processing room integrally with the mounting table, and a supporting member for supporting the current plate in such a manner that the current plate is parallel to the mounting plate.

In the present invention, the supporting member for supporting the current plate parallel to the mounting plate is provided, whereby the current plate is maintained parallel to the substrate mounted on the mounting table. Therefore, the speed of the atmospheric current flowing between the current plate and the substrate becomes uniform within the surface of the substrate, and hence, for example, a coating film applied, for example, in a manner of the aforementioned so-called one-stroke sketch is planarized uniformly within the surface of the substrate. Consequently, the coating film having a uniform film thickness can be formed on the substrate.

DETAILED DESCRIPTION OF THE PREFERRED EMBODIMENT

Figure 1:
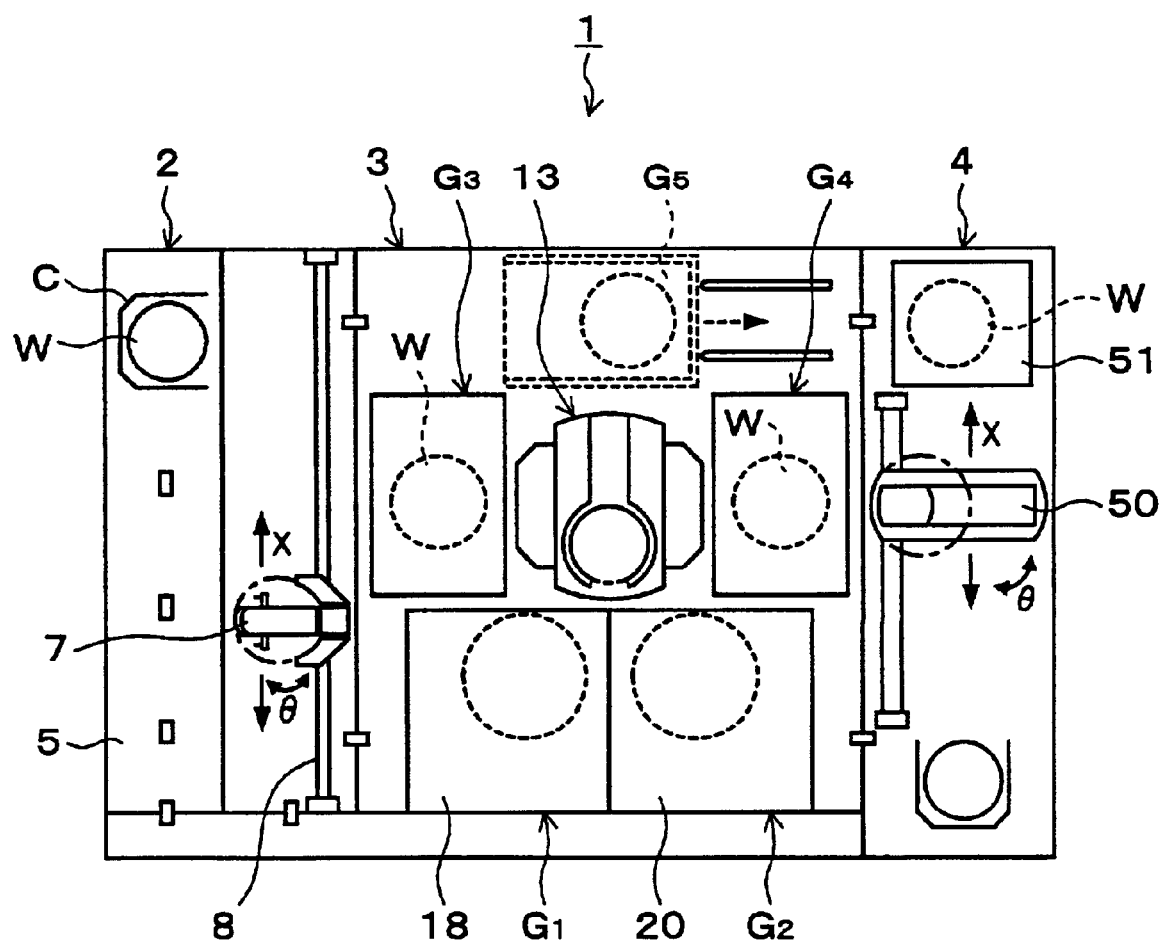
FIG. 1 is a plan view showing a sketch of the structure of a coating and developing system equipped with a reduced-pressure drying unit according to embodiments.
Figure 2:
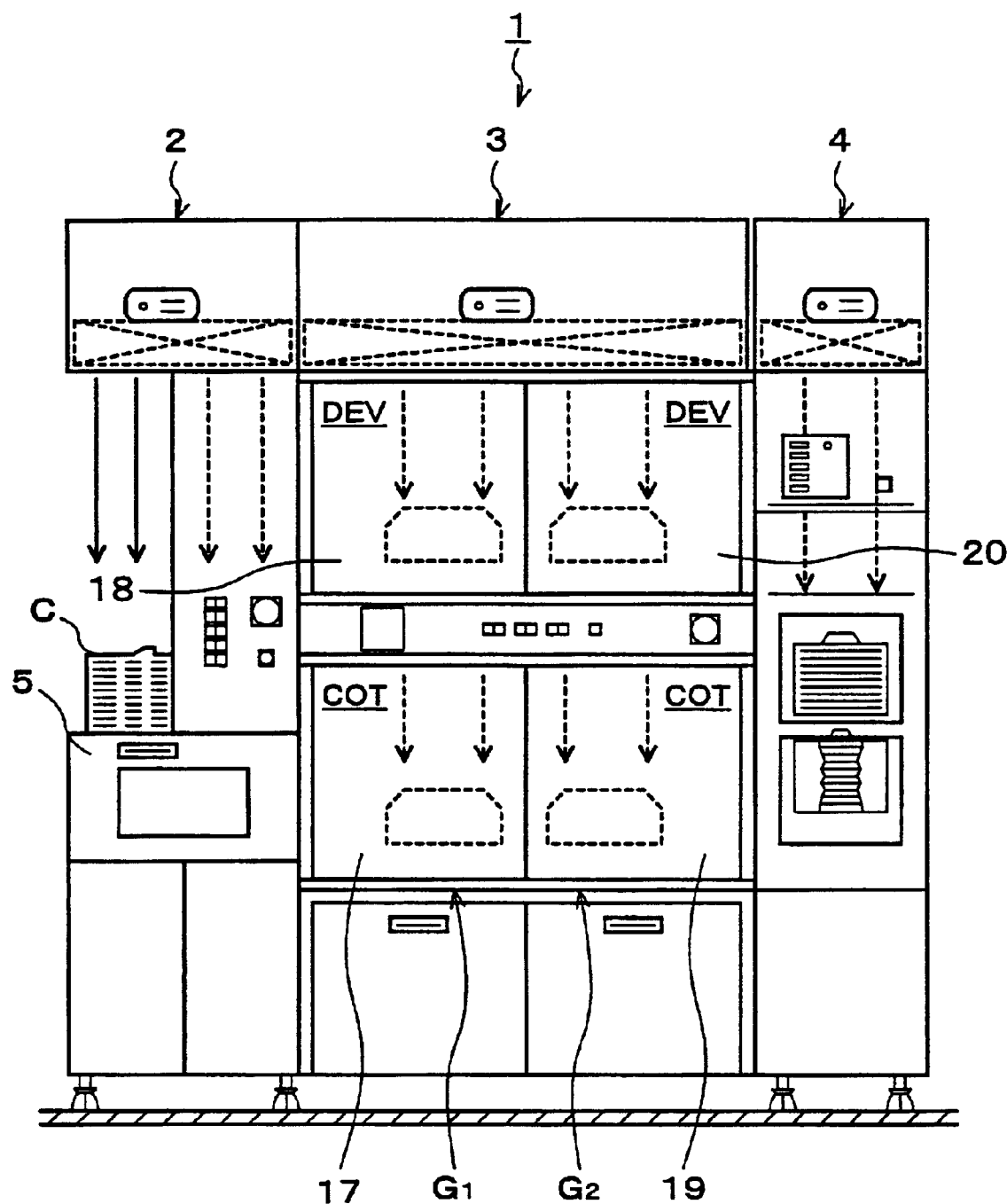
FIG. 2 is a front view of the coating and developing system in FIG. 1.
Figure 3:
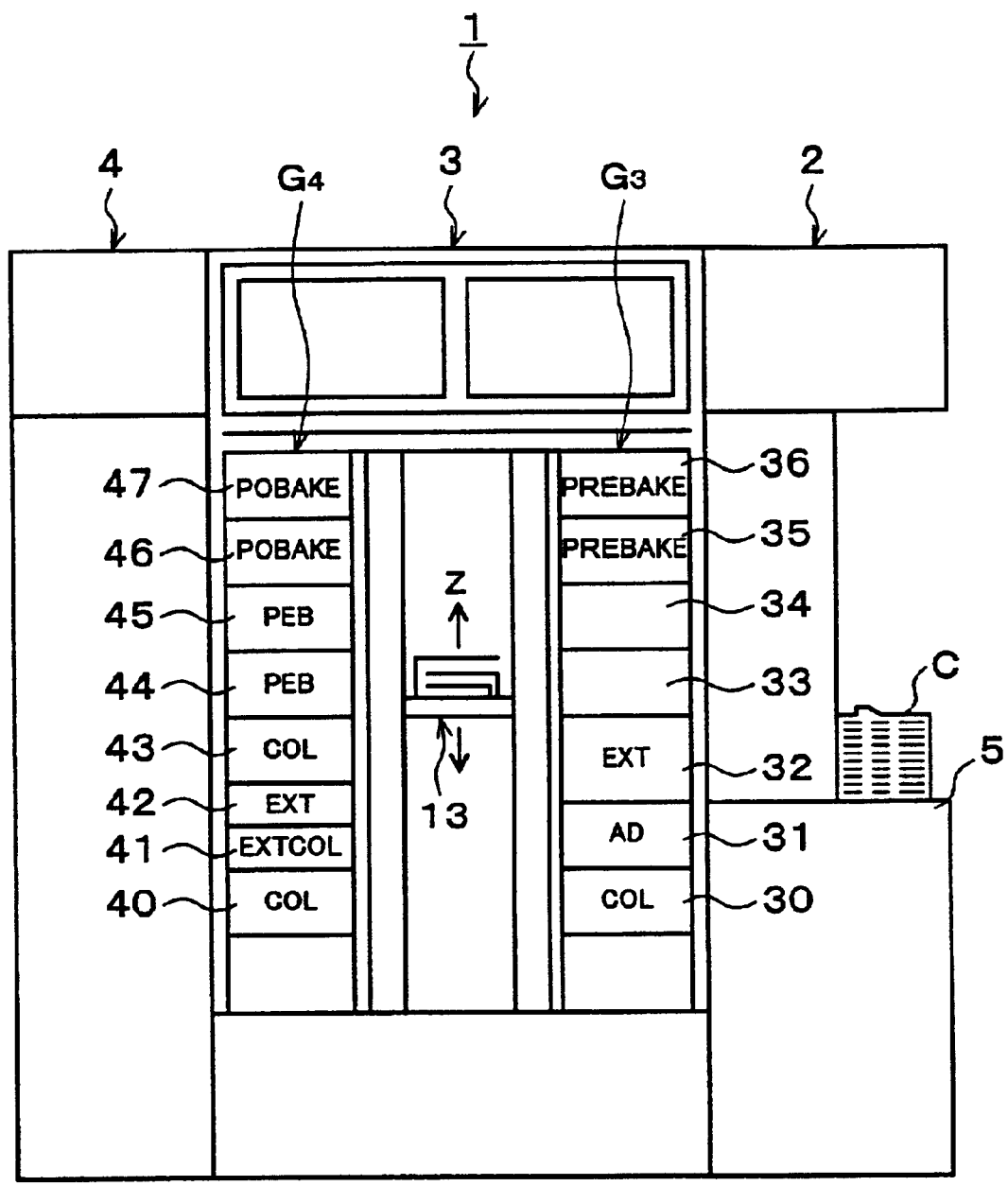
FIG. 3 is a rear view of the coating and developing system in FIG. 1.

Preferred embodiments of the present invention will be explained below. FIG. 1 is a plan view showing a sketch of the configuration of a coating and developing system 1 equipped with a substrate processing unit according to the present invention, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W per cassette, as a unit, from/to the outside into/out of the coating and developing system 1 and carrying the wafer W into/out of a cassette C, a processing station 3 in which various kinds of treatment and processing units each for performing predetermined treatment and processing for the wafers W one by one in coating and developing processes are stacked in multiple tiers, and an interface section 4 for receiving/sending the wafer W from/to an aligner not illustrated but provided adjacent to the processing station 3 are integrally connected.

In the cassette station 2, a plurality of cassettes C can be mounted at predetermined positions on a cassette mounting table 5 which is a mounting portion in a line in an X-direction (a top-to-bottom direction in FIG. 1). A wafer carrier 7 which is movable in the direction of arrangement of the cassettes (the X-direction) and in the direction of arrangement of the wafers W housed in the cassette C (a Z-direction; a vertical direction) is provided to be freely movable along a carrier guide 8 so as to selectively get access to each cassette C.

The wafer carrier 7 has an alignment function of aligning the wafer W. The wafer carrier 7 can also get access to an extension unit 32 included in a third processing unit group G3 on the processing station 3 side as will be described later.

In the processing station 3, a main carrier device 13 is provided at the center thereof, and various kinds of treatment and processing units are stacked in multiple tiers around the main carrier device 13 to compose processing unit groups. In the coating and developing system 1, four processing unit groups G1, G2, G3, and G4 are disposed. The first and second processing unit groups G1 and G2 are disposed on the front side of the coating and developing system 1, the third processing unit group G3 is disposed adjacent to the cassette station 2, and the fourth processing unit group G4 is disposed adjacent to the interface section 4. Further, a fifth processing unit group G5 shown by a broken line can be additionally disposed on the rear side as an option. The main carrier device 13 can carry the wafer W into/out of undermentioned various treatment and processing units arranged in these processing unit groups G1, G2, G3, G4, and G5. It should be noted that the number and disposition of processing unit groups are different depending on the type of treatment and processing given to the wafer W, and the number of processing unit groups can be selected optionally.

In the first processing unit group G1, for example, as shown in FIG. 2, a resist coating unit 17 for coating the wafer W with a resist solution and a developing unit 18 for subjecting the exposed wafer W to developing treatment are stacked in two tiers from the bottom in order. Similarly, in the second processing unit group G2, a resist coating unit 19 and a developing unit 20 are stacked in two tiers from the bottom in order.

The resist coating units 17 and 19 each include a resist discharge nozzle not illustrated for discharging the resist solution and a moving mechanism not illustrated for moving the resist discharge nozzle and the wafer W relative to each other. In the resist coating units 17 and 19, the application of the resist solution is performed in a manner of a so-called one-stroke sketch in which the resist solution is discharged onto the wafer W from the resist discharge nozzle while the resist discharge nozzle and the wafer W are moved relative to each other so that the surface of the wafer W is coated with the resist solution.

In the third processing unit group G3, for example, as shown in FIG. 3, a cooling unit 30 for subjecting the wafer W to cooling processing, an adhesion unit 31 for enhancing the adhesion of the resist solution and the wafer W, an extension unit 32 for making the wafer W wait therein, reduced-pressure drying units 33 and 34 each as a substrate processing unit according to this embodiment, pre-baking units 35 and 36 each for drying a solvent remaining in a resist film, or the like are stacked, for example, in seven tiers from the bottom in order.

In the fourth processing unit group G4, for example, a cooling unit 40, an extension and cooling unit 41 for naturally cooling the wafer W mounted therein, an extension unit 42, a cooling unit 43, post-exposure baking units 44 and 45 each for performing baking processing after exposure, post-baking units 46 and 47 each for performing baking processing after developing treatment, or the like are stacked, for example, in eight tiers from the bottom in order.

A wafer carrier 50 is provided at the center of the interface section 4. This wafer carrier 50 is structured to be movable in the X-direction (the top-to-bottom direction in FIG. 1) and in the Z-direction (the vertical direction) and rotatable in a θ-direction (a direction of rotation around a Z-axis) so as to get access to the extension and cooling unit 41 and the extension unit 42 included in the fourth processing unit group G4, an edge exposure unit 51, and the aligner not illustrated to carry the wafer W to each of them.

Next, the structure of the aforementioned reduced-pressure drying unit 33 will be explained. The reduced-pressure drying unit 33 has a chamber 60 which houses the wafer W and is hermetically closable. The chamber 60 is composed of a thick, almost disk-shaped mounting table 61 for mounting the wafer W thereon and an almost cylindrical lid body 62 with its lower face open which is positioned above the mounting table 61.

The lid body 62 is provided with a raising and lowering mechanism 63 for moving the lid body 62 up and down. The raising and lowering mechanism 63 has a driver 64 for raising and lowering the lid body 62, for example, by a pulse-controlled motor and a controller 65 for controlling the driver 64. Thereby, the lid body 62 can move vertically, and hence by being lowered, the lid body 62 can form a processing room S integrally with the mounting table 61.

In an inner side portion of the lid body 62, a projecting portion 66 projecting inward in a convex shape is provided annularly. Thereby, an outer edge portion of an undermentioned current plate 72 can be supported and raised.

An exhaust pipe 67 as an exhauster for exhausting an atmosphere in the processing room S is provided in the center of an upper face of the lid body 62. The exhaust pipe 67 communicates with a suction pump 88 for sucking the atmosphere in the processing room S at a predetermined pressure, and suction force of the suction pump 68 is controlled by a pump controller 69. Such a structure makes it possible to operate the suction pump 68 to exhaust and suck the atmosphere in the chamber 60 from the exhaust pipe 67 to thereby reduce a pressure in the chamber 60 and generate an atmospheric current in the chamber 60. On the lower end face of the lid body 62, O-rings 70 for ensuring the hermeticity of the processing room S are provided.

A supplier 71 for supplying gas, for example, nitrogen gas to the processing room S through the exhaust pipe 67 is connected to the exhaust pipe 67. Thereby, it is possible to supply gas to the processing room S after drying processing under reduced pressure to restore a reduced pressure state and purge the atmosphere in the processing room S.

A current plate 72 for controlling the atmospheric current in the processing room S, which is generated by the exhaust operation of the exhaust pipe 67, is provided in the chamber 60. The current plate 72 has, for example, a thin disk shape with its lower face flat. The lower face of the current plate 72 is subjected to surface working, and worked so that surface roughness is not more than 200 μm. A material with low thermal diffusivity such as high-density polyethylene, quartz, or a porous material is used as a material for the current plate 72. These materials have low thermal conductivity, and therefore, a change in the temperature of the wafer W due to heat from the current plate when the current plate approaches the wafer W is prevented.

Figure 5:
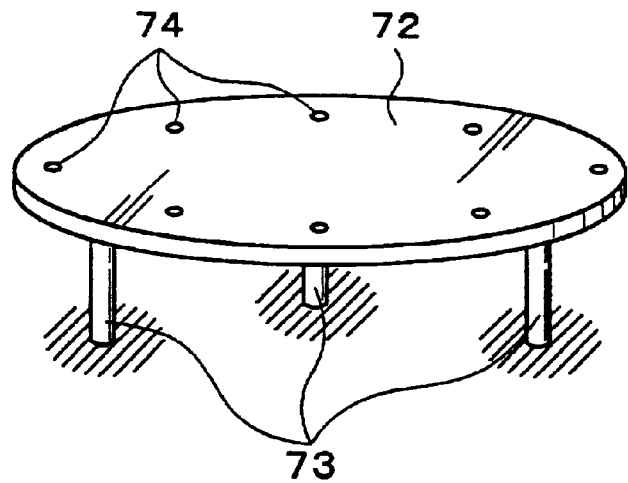
FIG. 5 is a perspective view of a current plate.

As shown in FIG. 5, three supporting members 73 which have a cylindrical shape and the same length are attached to the lower face of the current plate 72. Thereby, the current plate 72 is positioned above the mounting table 61 parallel thereto with the supporting members 73 therebetween.

Figure 6:
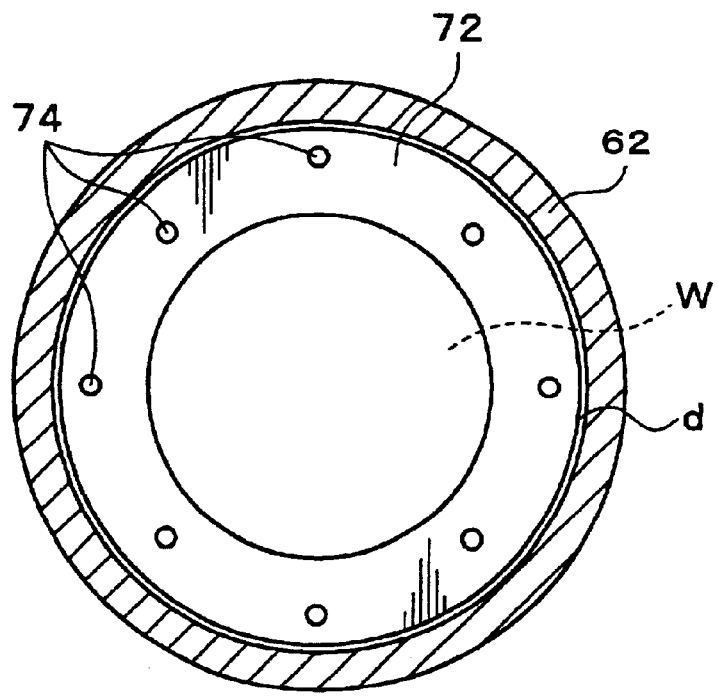
FIG. 6 is an explanatory view of a horizontal section showing a lid body and the current plate in the lid body.

As shown in FIG. 6, the current plate 72 has a diameter slightly smaller than the inner diameter of the lid body 62. Such a small clearance d that the current plate 72 can move relative to the lid body 62, for example, a clearance of about 1 mm is provided between the current plate 72 and the lid body 62.

In an outer edge portion of the current plate 72, a plurality of ventilation holes 74 with the same diameter, for example, of about 2 mm on the same circumference at even intervals are provided. The ventilation holes 74 are disposed at positions corresponding to the outer periphery of the wafer W on the mounting table 61. Consequently, when the atmosphere is exhausted from the exhaust pipe 67, the atmosphere on the surface of the wafer W is sucked from the respective ventilation holes 74 to an upper portion of the lid body 62, and a radial atmospheric current from the center to the outer edge portion of the wafer W is formed on the surface of the wafer W The outer edge portion of the current plate 72 can be freely supported on the aforementioned projecting portion 66. Accordingly, when the lid body 62 is raised, the current plate 72 is supported on the projecting portion 66 and thereby raised. When the lid body 62 is lowered and the processing room S is formed, the support of the projecting portion 66 for the current plate 72 is released, and the current plate 72 is positioned above the mounting table 61 with the supporting members 73 therebetween while not being in contact with the projecting portion 66.

The mounting table 61 is provided with a temperature adjusting member, for example, a Peltier element 75 for adjusting the mounting table 61 at a predetermined temperature. The temperature of the Peltier element 75 is controlled by a temperature controller 76 for controlling a power source of the Peltier element 75. Therefore, it is possible to adjust the mounting table 61 at the predetermined temperature and maintain the wafer W on the mounting table 61 at the predetermined temperature.

Proximity pins 77 are provided at positions corresponding to the outer edge portion of the wafer W above the mounting table 61, and the wafer W is mounted on these proximity pins 77. Thereby, heat exchange with the mounting table 61 is performed by radiation heat, whereby uniformity of the temperature within the surface of the wafer W can be secured.

A plurality of raising and lowering pins 78 which are means for supporting a lower face of the wafer W and raising and lowering the wafer W are provided under the mounting table 61. The raising and lowering pins 78 are provided upright on a flange 79. The raising and lowering pins 78 are freely movable in through-holes 80 provided near the center of the mounting table 61 respectively. The raising and lowering pins 78 are provided with a raising and lowering driver 81 including a cylinder or the like for vertically moving the flange 79. The raising and lowering pins 78 can move vertically in the through-holes 80 and protrude upward through the mounting table 61.

The raising and lowering pin 78 between the flange 79 and the through-holes 80 are respectively covered by extendable and contractible bellows 82. Therefore, an atmosphere in the outside is prevented from flowing into the processing room S through the through-holes 80, and hence the hermeticity of the processing room S is ensured.

Next, the operation of the reduced-pressure drying unit 33 structured as above will be explained with a photolithography process performed in the coating and developing system 1.

First, the wafer carrier 7 takes one unprocessed wafer W out of the cassette C and carries it into the extension unit 32 included in the third processing unit group G3. Then, the wafer W is carried into the adhesion unit 31 by the main carrier device 13 and coated with, for example, HMDS for enhancing the adhesion of the resist solution. The wafer W is then carried to the cooling unit 30 and cooled to a predetermined temperature. The wafer W cooled to the predetermined temperature is then carried to, for example, the resist coating unit 17 by the main carrier device 13.

The wafer W carried into the resist coating unit 17 is coated with the resist solution in a manner of the so-called one-stroke sketch. The wafer W coated with the resist solution is carried to the reduced-pressure drying unit 33 by the main carrier device 13.

The wafer W subjected to undermentioned processing in the reduced-pressure drying unit 33 is carried to the prebaking unit 35 and subjected to baking processing, and then carried to the extension and cooling unit 41 and cooled. Subsequently, the wafer W is taken out of the extension and cooling unit 41 by the wafer carrier 50, and then carried to the aligner (not illustrated) via the edge exposure unit 51, and a predetermined pattern is exposed on the wafer W. The wafer W which has undergone exposure processing is carried to the extension unit 42 by the wafer carrier 50, then by the main carrier device 13, carried to the post-exposure baking unit 44 to undergo baking processing, and thereafter carried to the cooling unit 43 to undergo cooling processing.

The wafer W which has undergone the cooling processing is carried to the developing unit 18 by the main carrier device 13, subjected to developing treatment, then carried to the post-baking unit 46 and the cooling unit 30 in sequence, in each of which the wafer W is subjected to predetermined processing. Thereafter, the wafer W is returned to the cassette C via the extension unit 32, and successive predetermined coating and developing treatment is completed.

Next, the operation of the aforementioned reduced-pressure drying unit 33 will be explained in detail. First, before the wafer W is carried to the reduced-pressure drying unit 33, the mounting table 61 is maintained at a predetermined temperature, for example, normal temperature, for example, 23° C. by the temperature controller 76 and the Peltier element 75.

Figure 7:
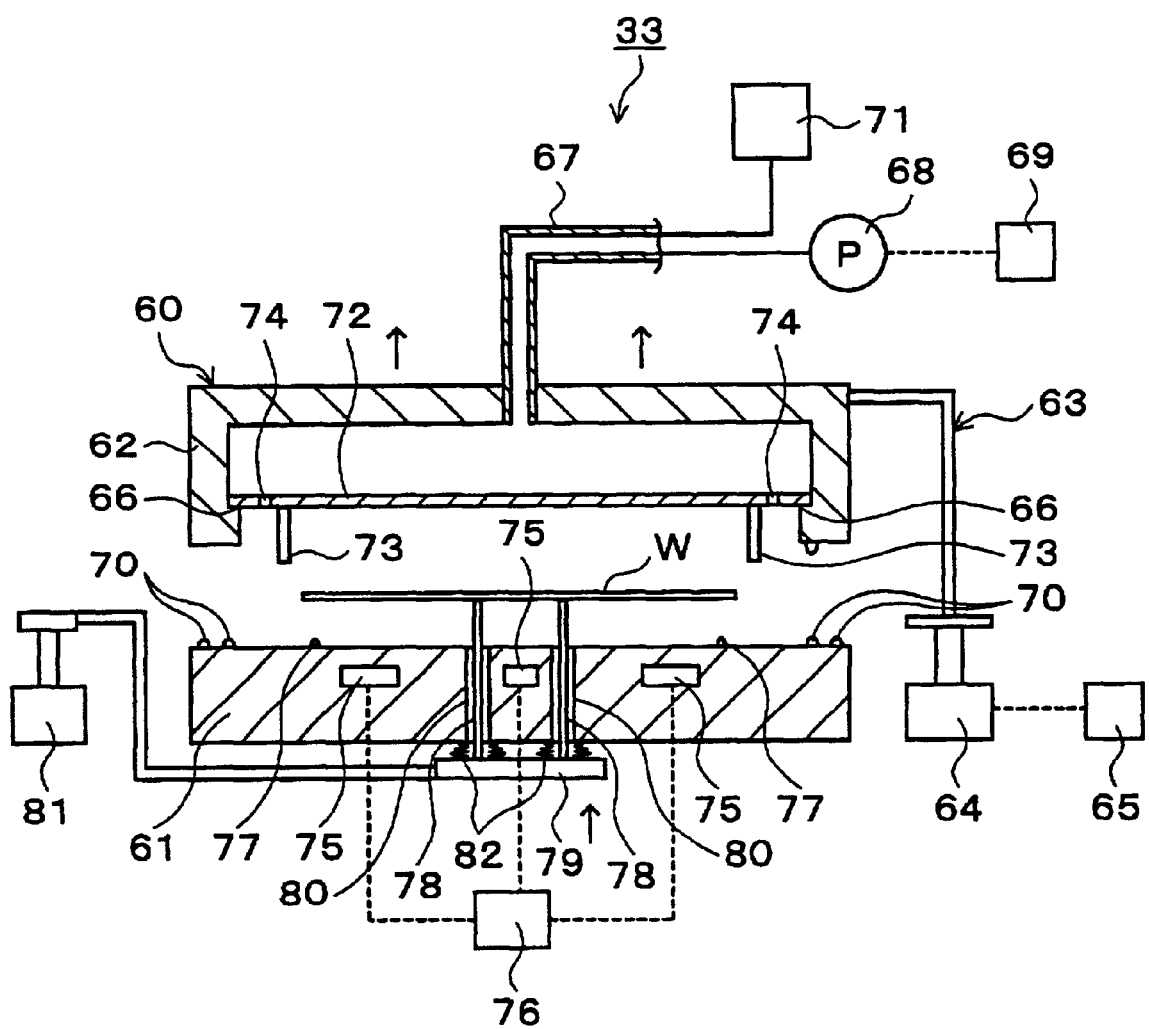
FIG. 7 is an explanatory view of a vertical section of the reduced-pressure drying unit when the lid body is raised.

When resist coating treatment as a previous process is completed, the wafer W is carried into the reduced-pressure drying unit 33 by the main carrier device 13 and moved to a position above the mounting table 61. At this time, as shown in FIG. 7, the lid body 62 is raised by the raising and lowering mechanism 63, and the current plate 72 is also raised while being supported by the projecting portion 66 of the lid body 62.

The wafer W moved to the position above the mounting table 61 is delivered to the raising and lowering pins 78 which were previously raised to a position above the mounting table 61 and have been waiting there. Subsequently, the raising and lowering pins 78 are lowered by the raising and lowering driver 81, and the wafer W is mounted on the proximity pins 77 on the mounting table 61.

Thereafter, the lid body 62 is lowered, and a lower end portion of the lid body 62 is closely attached to the mounting table 61, whereby the hermetic processing room S is formed. At this time, with the lowering of the lid body 62, the current plate 72 is lowered, and in the middle of the lowering of the lid body 62, the current plate 72 is mounted above the mounting plate 61 with the supporting members 73 therebetween. Thereby, the support of the projecting portion 66 for the current plate 72 is released, and the current plate 72 and the lid body 62 are brought into a non-contact state. The current plate 72 becomes parallel to the mounting table 61 by the supporting members 73.

Figure 4:
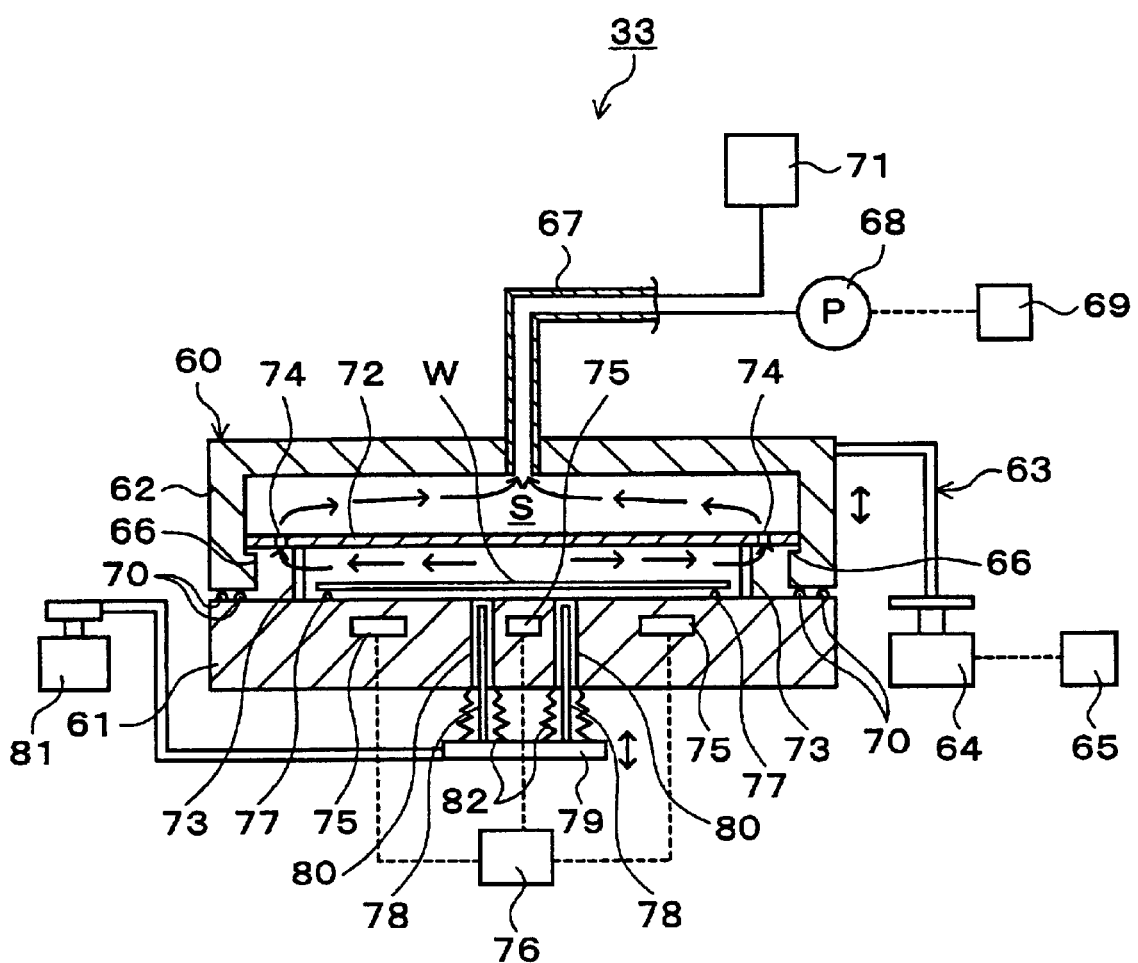
FIG. 4 is an explanatory view of a vertical section showing the structure of the reduced-pressure drying unit.

Subsequently, the suction pump 68 starts operating, and suction of the atmosphere in the processing room S through the exhaust pipe 67 at a predetermined pressure, for example, 0.013 KPa is started. With this suction, an atmospheric current is formed in the processing room S. As shown in FIG. 4, this atmospheric current flows from the center to the outer edge portion of the wafer W on the surface of the wafer W along the current plate 72, and thereafter flows through the ventilation holes 74 to the upper portion of the lid body 62 and then to the exhaust pipe 67. Accordingly, a surface layer of the resist film on the surface of the wafer W is leveled and planarized, and the solvent in the resist film is evaporated by a reduction in pressure, and thus the resist film on the wafer W is dried.

Thereafter, the drying processing under reduced pressure is performed for a predetermined period of time. After the predetermined period of time, the suction pump 68 is stopped, and a reduction in the pressure in the processing room S is stopped. Subsequently, nitrogen gas is supplied to the processing room S from the supplier 71 through the exhaust pipe 67, and the pressure in the processing room S is restored. When the pressure in the processing room S is restored to atmospheric pressure, the supply of the nitrogen gas is stopped.

Subsequently, the lid body 62 is raised by the raising and lowering mechanism 63, and the processing room S is opened. At this time, since the projecting portion 66 supports the outer edge portion of the current plate 72, the current plate 72 is also raised. In the same manner as in carry-in, the wafer W is raised by the raising and lowering pins 78 and delivered to the main carrier device 13. The wafer W delivered to the main carrier device 13 is carried out of the reduced-pressure drying unit 33, and carried to the prebaking unit 35 where the next process is performed.

In the aforementioned embodiment, the supporting members 73 are attached to the current plate 72, and hence the current plate 72 can be positioned above the wafer W while being mounted above the mounting table 61 with the supporting members 72 therebetween, whereby the current plate 72 and the wafer W can be maintained parallel to each other relative to the mounting plate 61. Accordingly, a space between the current plate 72 and the wafer W becomes uniform within the surface of the wafer W, whereby an atmospheric current flowing in this space is formed uniformly. As a result, drying processing for the wafer W under reduced pressure is performed uniformly within the surface of the wafer W, and hence a resist film with a uniform film thickness is formed on the wafer W.

The current plate 72 is shaped to fit in with the inner diameter of the lid body 62, and the plural ventilation holes 74 are provided at even intervals at the same radius in the outer edge portion of the current plate 72, whereby a uniform atmospheric current with the same flow speed is formed from the center to the outer edge portion of the wafer W.

Since the lid body 62 is provided with the projecting portion 66, the current plate 72 can be moved up and down, interlocking with the lid body 62. Consequently, interference between the wafer W and the current plate 72 when the wafer W is carried to the reduced-pressure drying unit 33 can be avoided.

Moreover, when the processing room S is formed, the support of the projecting portion 66 for the current plate 72 is released, and the current plate 72 and the lid body 62 are brought into a non-contact state, which prevents a parallel state of the current plate 72 from being impaired by the lid body 62.

The lower face of the current plate 72 is worked to have a flat surface, and hence the atmospheric current flows smoothly along the lower face of the current plate 72, whereby the stable atmospheric current is formed. Consequently, drying under reduced pressure for the wafer W which is influenced by the atmospheric current is performed suitably.

Further, high-density polyethylene or quartz, with low thermal diffusivity, is used as the material for the current plate 72, whereby radiation of heat from the current plate 72 is reduced, and hence the wafer W can be maintained at an appropriate temperature. The material of the current plate 72 is not limited to high-density polyethylene or quartz, and other materials with thermal diffusivities of $1 \times 10^{-8}$ to $1 \times 10^{-4}$ m$^2$/sec or less may be possible.

In the aforementioned embodiment, the supporting members 73 are attached to the lower face of the current plate 72, but the supporting members 73 may be attached to the mounting table 61 side.

Figure 8:
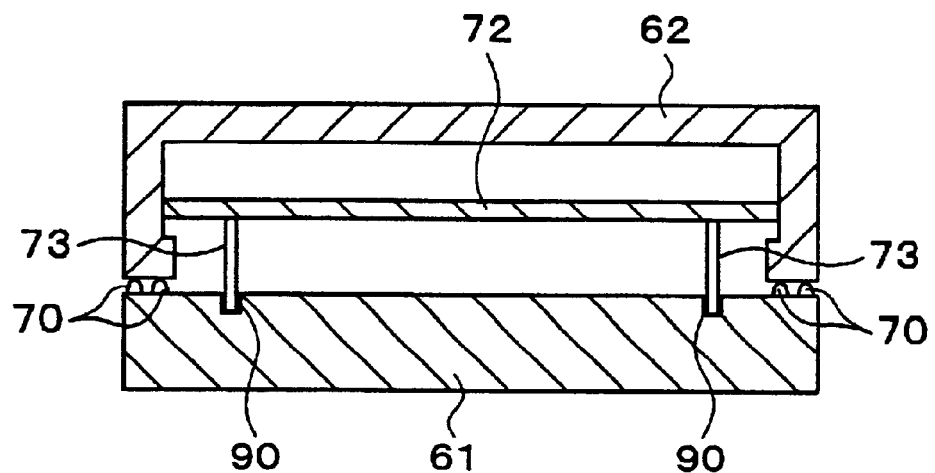
FIG. 8 is an explanatory view of a vertical section of the reduced-pressure drying unit when recessed portions for supporting members are provided.

As shown in FIG. 8, recessed portions 90 for accommodating lower portions of the supporting members 73 may be provided in the mounting table 61. This provision of the recessed portions 90 enables the alignment of the supporting members 73 at appropriate positions. Moreover, by shaping the recessed portions 90 to fit in with the supporting members 73, the supporting members 73 can be prevented from getting out of position. Consequently, the position of the current plate 72 is stabilized, and a stable proper atmospheric current is formed between the wafer W and the current plate 72.

Figure 9:
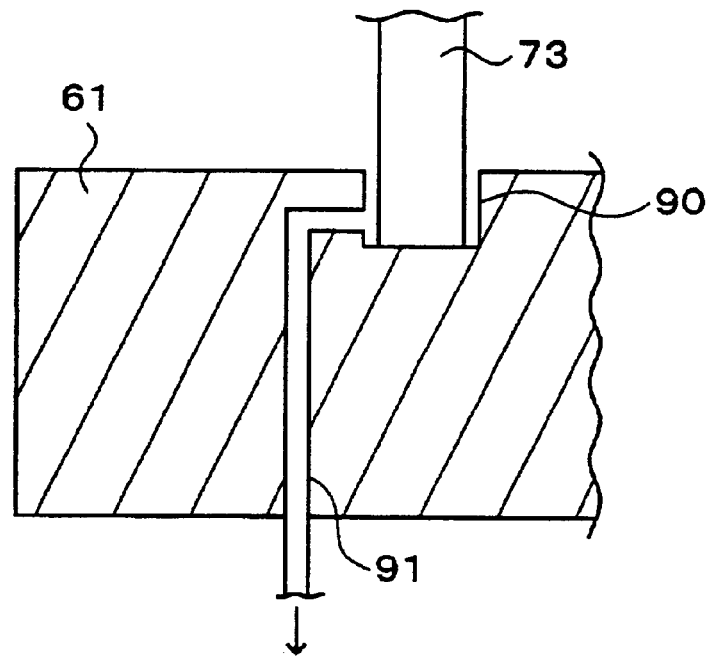
FIG. 9 is an explanatory view of a vertical section of a mounting table when an exhaust pipe is provided in the recessed portion in FIG. 8.

As shown in FIG. 9, in each of the recessed portions 90, an exhaust pipe 91 for exhausting an atmosphere in the recessed portion 90 may be provided. Therefore, dust and the like caused by contact between the supporting member 73 and the recessed portion 90 can be exhausted from the exhaust pipe 91, which prevents the wafer W from being contaminated by the dust.

Figure 10:
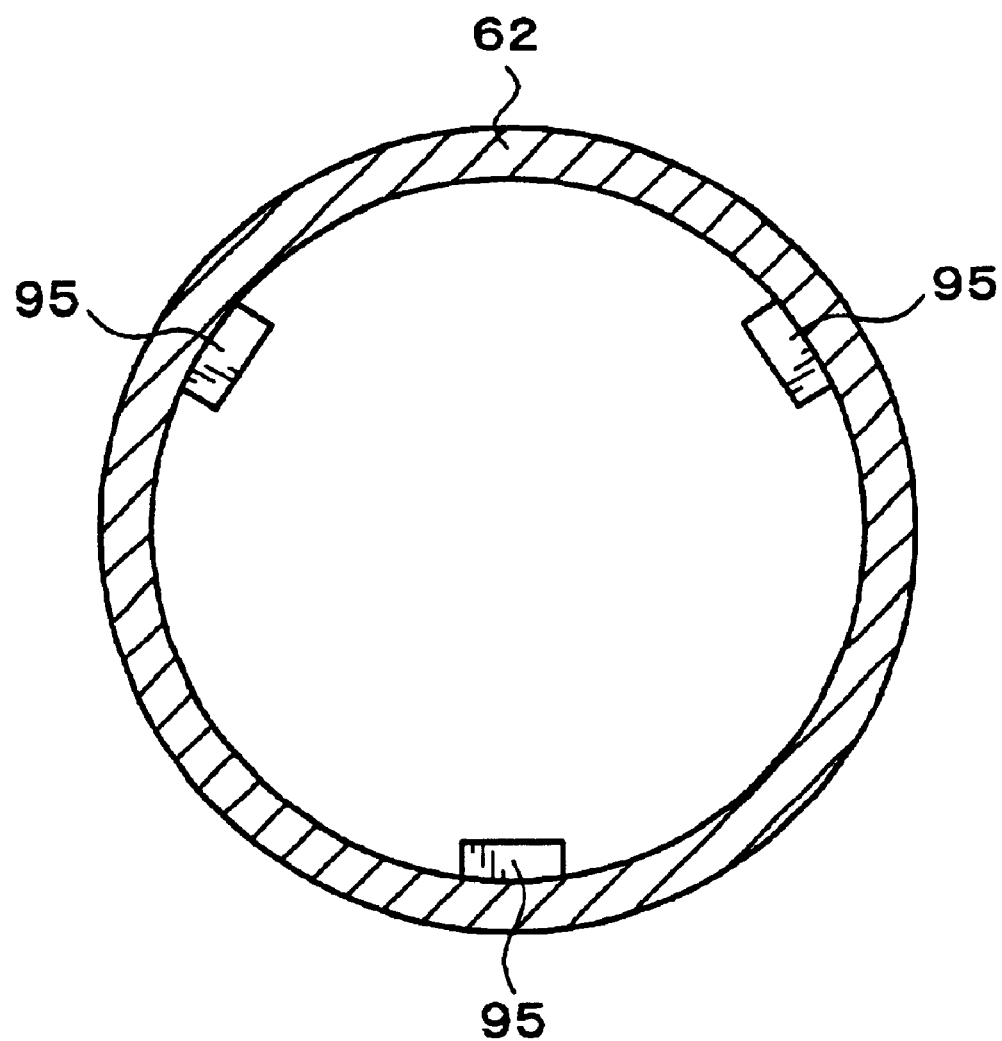
FIG. 10 is an explanatory view of a horizontal section of the lid body showing another example of the structure of the lid body.

The projecting portion 66 of the lid body 62 described in the aforementioned embodiment is provided annularly, but as shown in FIG. 10, a plurality of projecting portions 95 projecting to the inner side of the lid body 62 may be provided at predetermined positions. Hence, the area of contact between the lid body 62 and the current plate 72 reduces, which can reduce impurities caused by this contact.

The shape of each of the ventilation holes 74 of the current plate 62 described in the aforementioned embodiment is circular, but other shapes, for example, a slit shape and an arc shape are also possible.

In the aforementioned embodiment, the current plate 72 is supported by the supporting members 73, but it is also possible to provide a hanging supporting member for hanging the current plate 72 from the lid body, on an upper face of the current plate 72, attach an engaging portion to the hanging supporting member, and provide an engaged portion with which the engaging portion engages in the lid body. An example in which such a structure is adopted will be explained below as a second embodiment.

Figure 11:
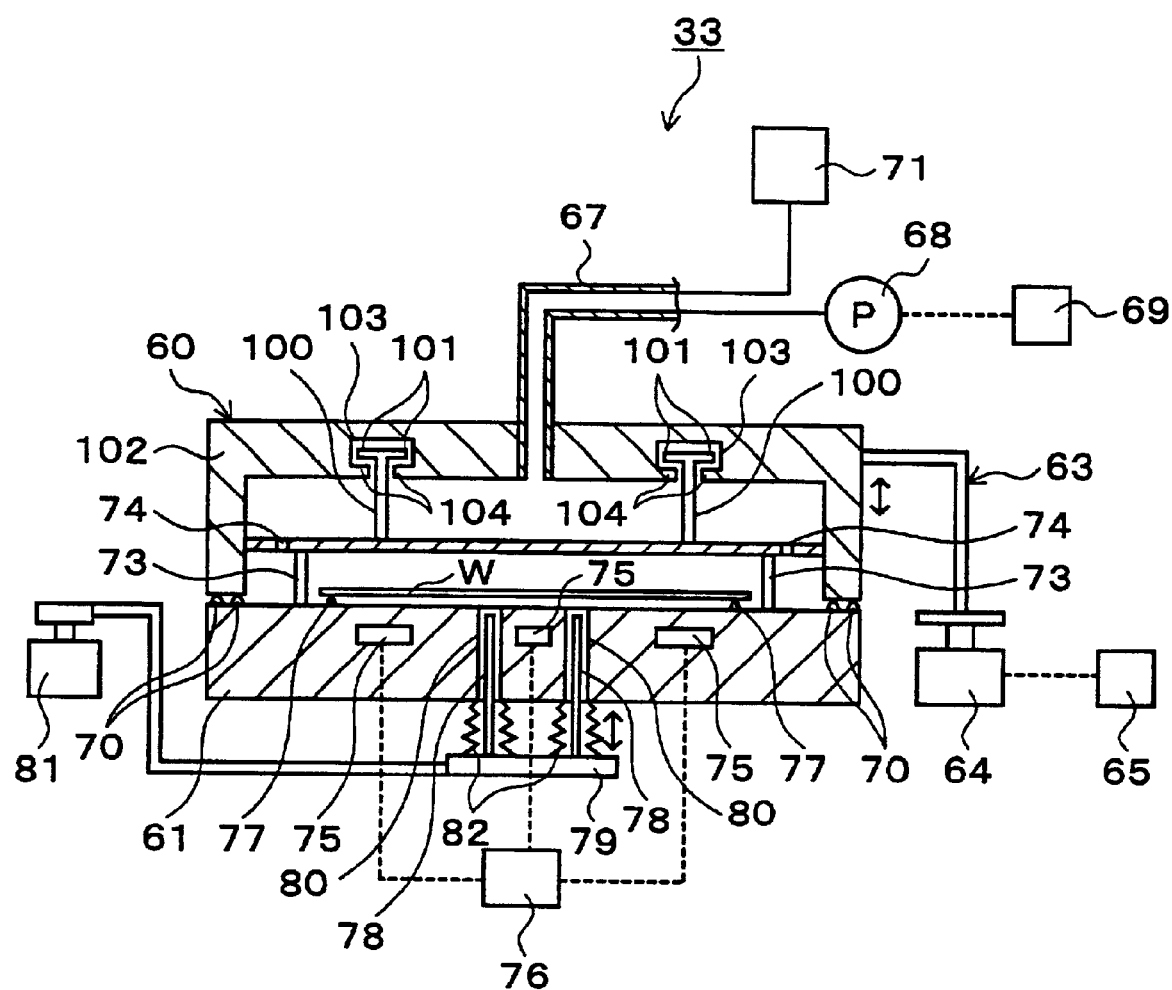
FIG. 11 is an explanatory view of a vertical section of the reduced-pressure drying unit when the current plate is supported by hanging supporting members.

As shown in FIG. 11, hanging supporting members 100 for hanging the current plate 72 are attached to the upper face of the current plate 72. An engaging portion 101 protruding outward in a convex shape is provided at an upper end portion of each of the hanging supporting members 100. At a position opposite each of the engaging portions 101, an opening 103 large enough for the engaging portion 101 to move up and down therein is provided. At an opening portion of each of the openings 103, an engaged portion 104 projecting inward in a convex shape is provided. The engaging portion 101 in the opening 103 can engage with the engaged portion 104. The length of the hanging supporting member 100 is set so that when a lid body 102 is lowered and the processing room S is formed, the engagement of the engaging portion 101 with the engaged portion 104 is released. Other structures are the same as those in the first embodiment.

Figure 12:
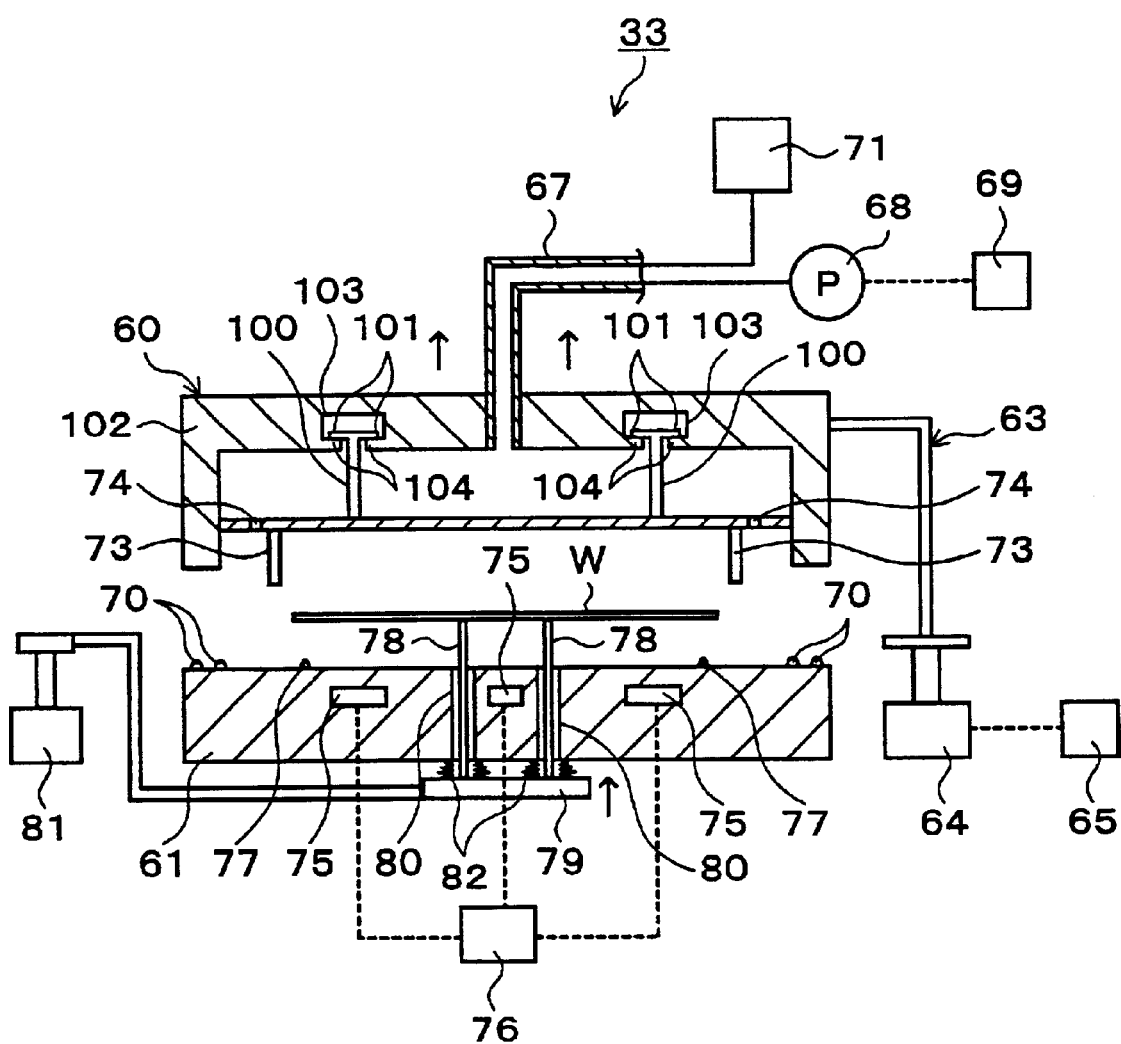
FIG. 12 is an explanatory view of a vertical section of the reduced-pressure drying unit in FIG. 11 when a lid body is raised.

When the lid body 102 is raised when the wafer W is carried to the reduced-pressure drying unit 33, as shown in FIG. 12, the engaging portions 101 of the hanging supporting members 100 engage with the engaged portions 104, and the current plate 72 is raised by the hanging supporting members 100. When the wafer W is mounted on the mounting table 61, the lid body 102 is lowered, and the current plate 72 is also lowered. When the processing room S is formed with the lowering of the lid body 102, the current plate 72 is mounted above the mounting table 61 with the supporting members 73 therebetween, and the engagement of the engaging portions 101 of the hanging supporting members 100 with the engaged portions 104 is released.

According to such a second embodiment, when the wafer W is carried into/out of the reduced-pressure drying unit 33, the current plate 72 can evade upward, whereby contact between the wafer W and the current plate 72 can be avoided. Moreover, when the current plate 72 is mounted above the mounting table 61 with the supporting members 73 therebetween at a predetermined position above the wafer W, the engagement of the engaging portions 101 with the engaged portions 104 is released, and hence the parallel state of the current plate 72 is not impaired.

In the second embodiment, an exhaust pipe for exhausting an atmosphere in the opening 103 may be provided in each of the openings 103 formed in the lid body 102. Thereby, it is possible to exhaust particles and the like caused by contact between the engaging portion 101 and the engaged portion 104 to thereby prevent the wafer W from being contaminated by the impurities.

Figure 13:
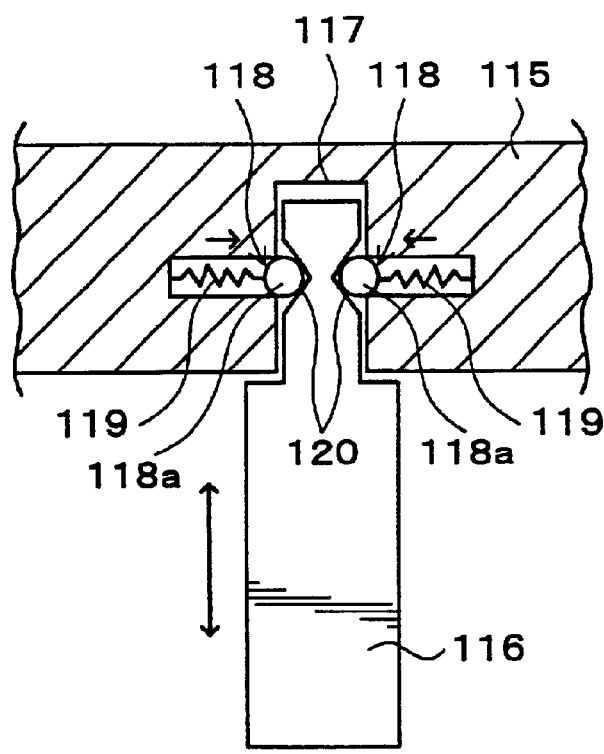
FIG. 13 is an explanatory view of a vertical section of a current plate when a supporting member is detachable.

The supporting members 73 described in the aforementioned embodiments may be freely detached. In such a case, for example, as shown in FIG. 13, a bottom closed hole 117 in which a supporting member 116 can be freely inserted is provided on the lower face side of a current plate 115. Stoppers 118 urged toward the center in the closed bottom hole 117 are provided on an inner peripheral face of the closed bottom hole 14. Each of the stoppers 118 has an spherical portion 118a and is urged, for example, by a spring 119. An outer periphery of the supporting member 116 has an external shape which fits in with the closed bottom hole 117, and an annular and almost V-shaped groove 120 in which the spherical portions 118a of the stoppers 118 can be put is formed in a part of the outer periphery of the supporting member 116.

On the occasion of attachment of the supporting member 116, the supporting member 116 is inserted into the closed bottom hole 117, and the spherical portions 118a of the stoppers 118 are put in the groove 120. Thereby, the supporting member 116 is engaged by the stoppers 118. Meanwhile, on the occasion of detachment of the supporting member 116, by drawing out the supporting member 116 from within the closed bottom hole 117, each of the spherical portions 118a of the stoppers 118 is pushed to the spring 119 side, and the engagement by means of the stoppers 18 is released. Such a structure allows the supporting member 116 to be freely detachable from the current plate 115. Accordingly, by exchanging the supporting member 116 with the supporting member 116 with a different length, the distance between the current plate 115 and the wafer W can be changed, and the flow speed of an atmospheric current can be changed. Consequently, an atmospheric current suitable for a recipe of the wafer W can be formed, and hence a suitable resist film is formed on the wafer W.

Figure 14:
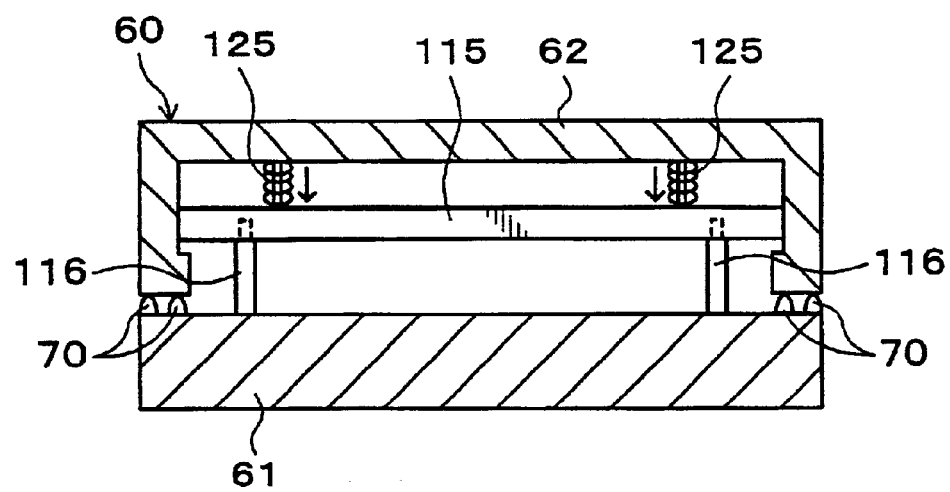
FIG. 14 is an explanatory view of a vertical section showing a sketch of the reduced-pressure drying unit when springs are provided on the lid body.

Incidentally, when the spherical portions 118a of the stoppers 118 are put in the V-shaped groove 120 to engage the supporting member 116, the stoppers 118 are not completely fixed in the groove 120, and hence there occurs play between the stoppers 118 and the groove 120, which raises the possibility that the current plate 115 moves even by small external force. Accordingly, as shown in FIG. 14, an elastic member, for example, a spring 125 which presses the current plate 115 in the direction from top to bottom may be provided on the upper face of the lid body 62. A plurality of springs 125 are provided, and placed evenly on the upper face of the lid body 62 so that the current plate 115 is kept parallel. In this case, the springs 125 with such elasticity that the lid body 62 is not lifted by reaction force of the springs 125 are used. Namely, the springs 125 having such spring constant, number of springs, length and the like that the force with which the lid body 62 is lowered by the raising and lowering mechanism 63 is larger than the force with which the springs 125 presses the current plate 115 and which is the same as the reaction force of the springs 125, are used.

By such a structure, when the lid body 62 is lowered, the current plate 115 is pressed downward by the springs 125, and thus small movements of the current plate 115 are prevented. Moreover, since the current plate 115 is pressed by the springs 125, even when the lid body 62 is inclined, the inclination is reduced by the springs 125, and hence the parallel state of the current plate 115 is maintained. It should be noted that the number of the springs may be one, and in this case, the spring 125 is provided in the center of the lid body 62.

Figure 15:
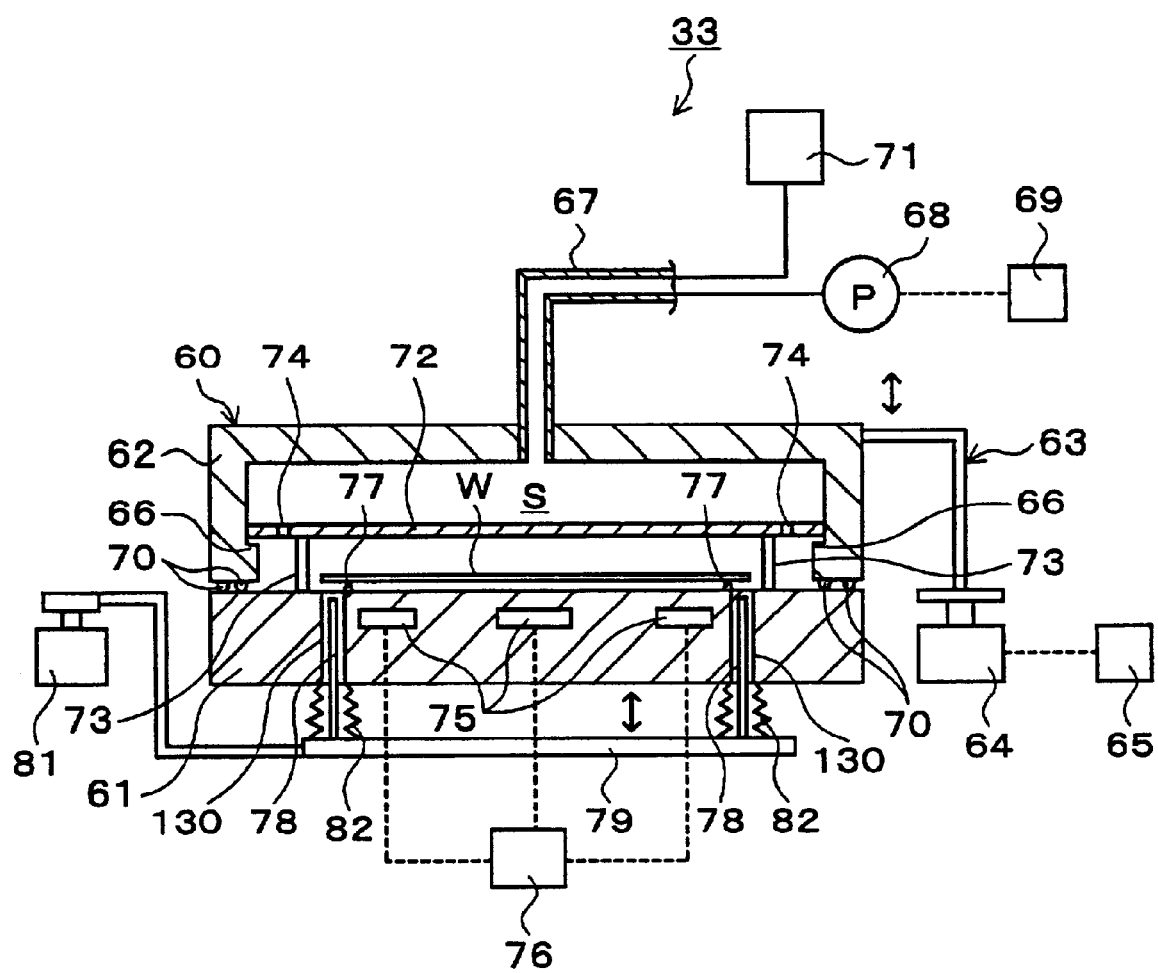
FIG. 15 is an explanatory view of a vertical section of the reduced-pressure drying unit when through-holes are provided opposite an outer edge portion of a wafer.

Although the through-holes 80 for moving the raising and lowering pins 78 therethrough are provided in the center of the mounting table 61 in the aforementioned embodiments, they may be provided at positions corresponding to the outer edge portion of the wafer W on the mounting table 61. In such a case, for example, as shown in FIG. 15, through-holes 130 as holes are disposed at positions corresponding to the outer edge portion of the wafer W so as not to interfere with the proximity pins 77. Thus, the through-holes 130 having different temperature in the mounting table 61 are positioned at the outer edge portion of the wafer W, which is not included in a product, whereby the uniformity of the temperature within the surface of the wafer W, in portions of the wafer W as the product, is improved.

When being provided opposite the outer edge portion of the wafer W on the mounting table 61, it is recommended to dispose the through-holes 130 so that the main carrier device 13 and the raising and lowering pins 78 do not interfere with each other, and provide a notch portion in an arm portion of the main carrier device 13.

Figure 16:
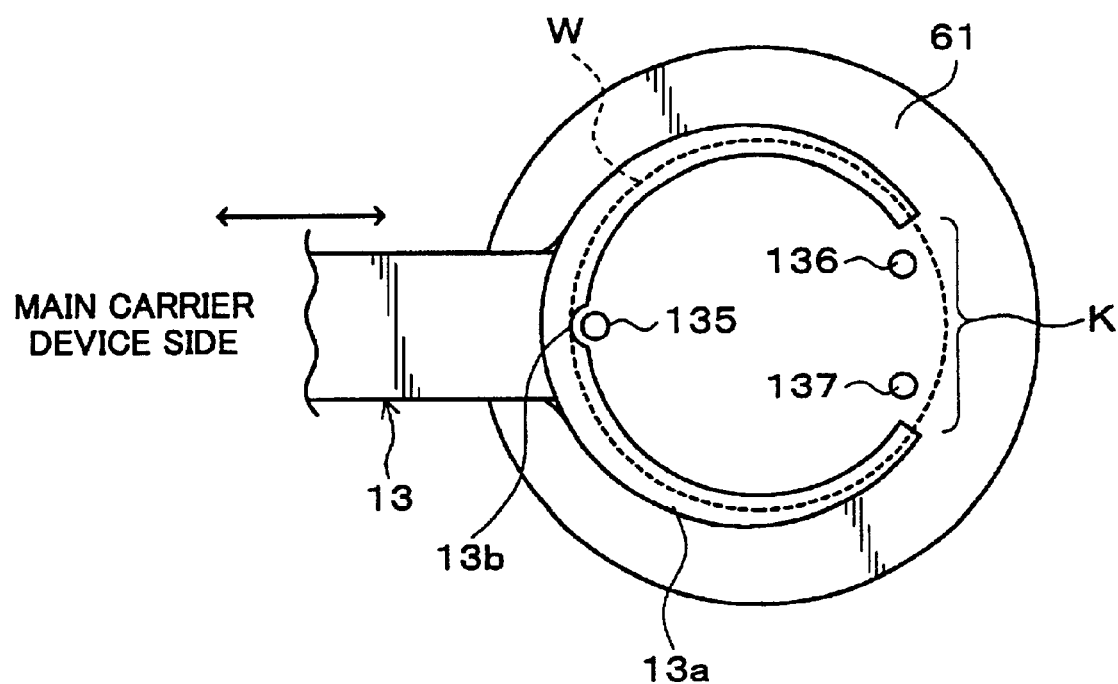
FIG. 16 is a plan view of the mounting table showing the positional relationship between a carrier arm and through-holes.

In such a case, for example, as shown in FIG. 16, a through-hole 135 out of three through-holes 135, 136, and 137 is formed at a position closest to the main carrier device 13, opposite the outer edge portion of the wafer W on the mounting table 61. It is recommended to form the through-hole 136 and the through-hole 137 at positions on the opposite side to the main carrier device 13, opposite the outer edge portion of the wafer W on the mounting table 61.

Meanwhile, an arm portion 13a of the main carrier device 13 has an almost C-shaped front end, and can carry the wafer W while supporting the outer edge portion of the wafer W. This arm portion 13a is provided with a notch portion 13b so as not to interfere with the raising and lowering pin 78 which protrudes from the through-hole 135. The notch portion 13b is provided at such a position as to face the through-hole 135 when the arm portion 13a is positioned above the mounting table 61.

The front end portion of the arm portion 13a is provided with a gap portion K so as not to interfere with the raising and lowering pins 78 which protrude from the through-holes 136 and 137. Thereby, when the main carrier device 13 moves to a position above the mounting table 61, the raising and lowering pin 78 protruding from the through-hole 135 is positioned in the notch portion 13b, and the other raising and lowering pins 78 are positioned in the gap portion K of the arm portion 13a. Therefore, even when the through-holes 135, 136, and 137 are provided opposite the outer edge portion of the wafer W on the mounting table 61, the wafer W can be carried suitably without the main carrier device 13 interfering with the raising and lowering pins 78.

Figure 17:
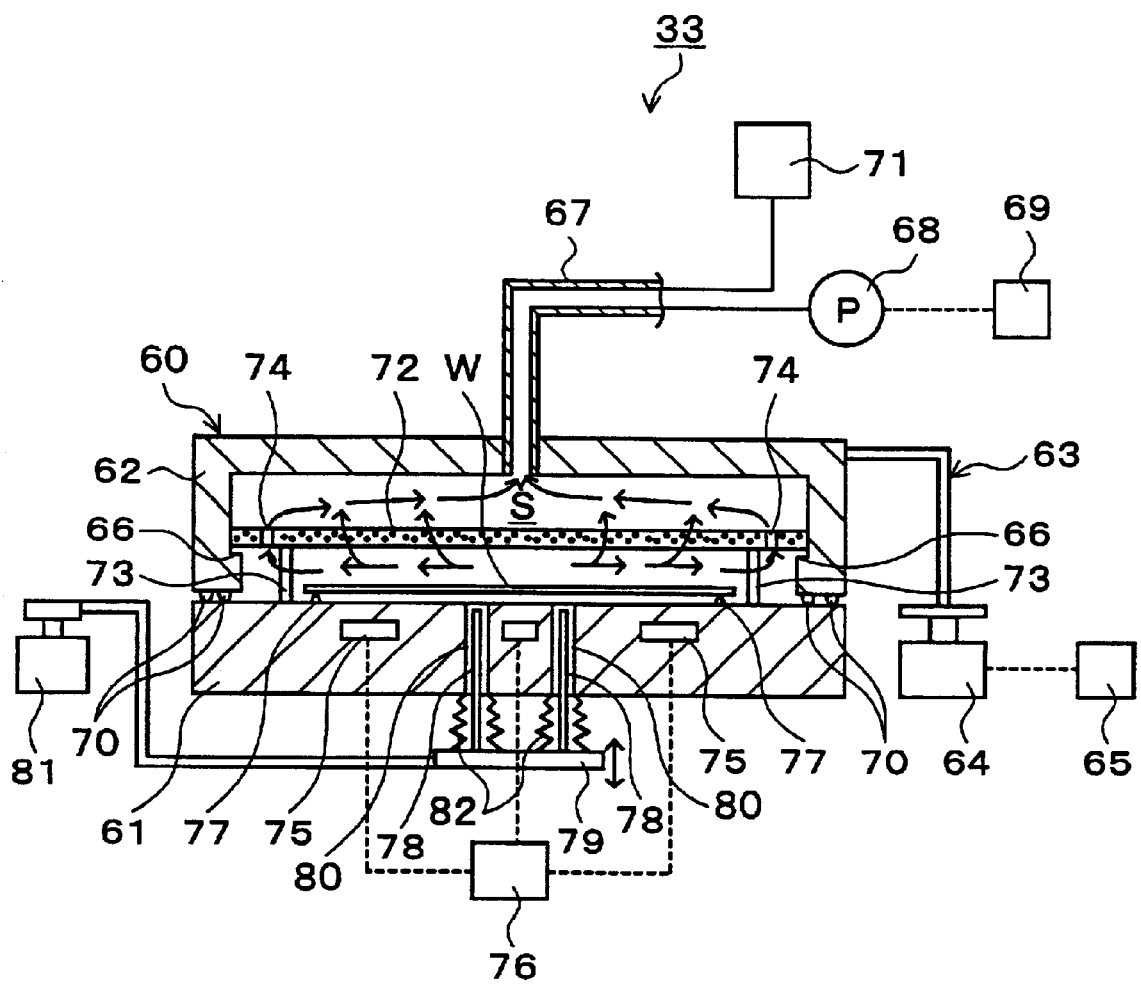
FIG. 17 is an explanatory view of a vertical section of the reduced-pressure drying unit showing the flow of an atmospheric current when a material having porosity is used as a material for the current plate.

A material having porosity, for example, a porous member may be used as the material for the current plate 72 in the aforementioned embodiments. By using the material having porosity as the material for the current plate 72 as stated above, as shown in FIG. 17, part of the atmospheric current formed between the current plate 72 and the wafer W comes to pass through the current plate 72. Therefore, evaporation of the solvent in the resist solution which has been performed intensively at the outer edge portion of the wafer W is performed over the entire surface within the surface of the wafer W. Accordingly, the resist solution on the wafer W is prevented from flowing to the outer edge portion of the wafer W and being evaporated, which prevents the resist film formed at the outer edge portion of the wafer W from swelling.

Figure 18:
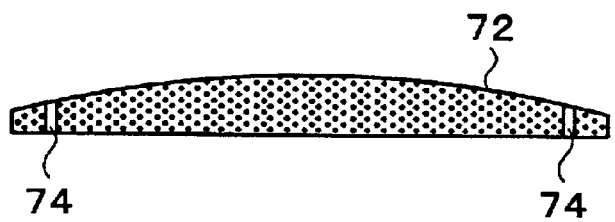
FIG. 18 is a vertical sectional view of the porous current plate shaped so that a central portion thereof swells.

When such a porous material is used as the material for the current plate 72, as shown in FIG. 18, it is preferable to change the shape of the current plate 72 in such a manner that the thickness of a central portion thereof is larger than that of a peripheral portion thereof. As a result, pressure loss when the atmospheric current passes through the current plate 72 is larger in the center portion.

Accordingly, even when the exhaust pipe 67 is placed at the center above the wafer W as shown in FIG. 17, the quantity of the atmospheric current passing through the current plate 72 can be adjusted so that quantities of the atmospheric current in the central portion and the peripheral portion are uniform. When the thickness of the central portion is made larger, it is desirable that the thickness be made larger gradually from the peripheral portion as in an example shown in FIG. 18.

Moreover, when the porous material is used as the material for the current plate, the atmospheric pressure pass through the current plate 72, and hence the ventilation holes 74 in the peripheral edge portion need not be provided.

When the current plate 72 made of the porous material shown in FIG. 17 and FIG. 18, in order to prevent minute asperities on the lower face of the current plate 72 from being transferred to the surface of the wafer W under processing, it is desirable to rotate such a current plate 72 during processing.

Figure 19:
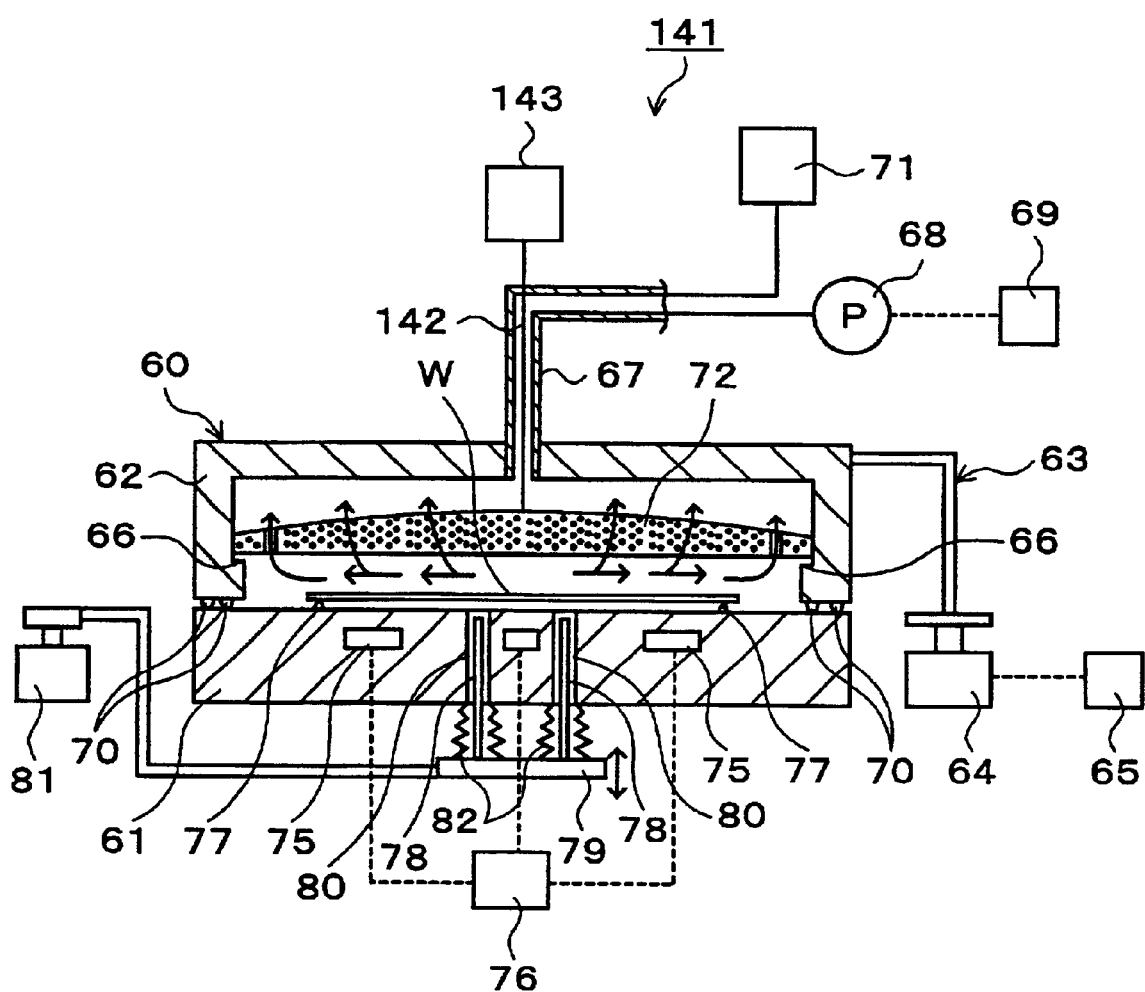
FIG. 19 is an explanatory view of a vertical section of a reduced-pressure drying unit including a mechanism for rotating the current plate in FIG. 18.

FIG. 19 shows a reduced-pressure drying unit 141 including a mechanism for rotating the current plate 72. In this reduced-pressure drying unit 141, a shaft 142 is attached to the center of the current plate 72, and the shaft 142 is connected to a motor 143 through the inside of the exhaust pipe 67. Since the current plate 72 is hung by the shaft 142, this shaft 142 corresponds to a supporting member of the present invention.

Thanks to the aforementioned structure, when the motor 143 starts operating, the current plate 72 is rotated above the wafer W. The rotation speed is, for example, about 5 rpm to about 15 rpm. Even if particles occur around the shaft 142, the particles are exhausted from the exhaust pipe 142, whereby there is no possibility that the wafer W is adversely affected by the particles.

In the above explanation, as for "a pipe", for example, in a exhaust pipe or the like, naturally, a tube also produces the same operational effects, and hence it is included in the scope of the present invention.

In the embodiments explained above, the present invention is applied to a reduced-pressure drying unit for a wafer in a photolithography process of semiconductor wafer device fabrication processes, but the present invention can be also applied to a reduced-pressure dying unit for substrates other than a semiconductor wafer, for example, an LCD substrate and a glass substrate for a photomask.

According to the present invention, a uniform atmospheric current is formed on a substrate, whereby a coating film on the substrate is planarized to have a uniform thickness by the atmospheric current. Accordingly, the coating film with a uniform thickness is formed on the substrate, and an improvement in yield can be realized.

What is claimed is:

1. A processing unit for processing a substrate, comprising:
   a chamber for housing the substrate and forming a hermetically closeable processing room;
   an exhauster for exhausting an atmosphere in the processing room from an upper portion of the chamber to reduce a pressure in the processing room; and
   a current plate for controlling an atmospheric current formed in the processing room when the pressure is reduced,
   wherein said chamber includes a mounting table for mounting the substrate thereon, an almost cylindrical lid body with its lower face open for covering the substrate on the mounting plate from above and forming the processing room integrally with the mounting table, and a supporting member for supporting said current plate in such a manner that said current plate is parallel to the mounting plate,
   wherein three or more supporting members are attached to said current plate, and
   wherein said current plate is positioned above the mounting table with the supporting members therebetween.

2. A processing unit as set forth in claim 1,
   wherein said current plate has a disk shape with almost the same diameter as an inner diameter of the lid body,
   wherein said current plate is provided with a plurality of ventilation holes on the same circumference, and
   wherein the ventilation holes are positioned outside the substrate on the mounting table in plan view.

3. A processing unit as set forth in claim 1,
   wherein a raising and lowering mechanism for raising and lowering the lid body is provided,
   wherein a hanging supporting member for hanging said current plate from the lid body is attached to an upper face of said current plate;
   wherein the hanging supporting member is provided with an engaging portion; and
   wherein the lid body is provided with an engaged portion with which the engaging portion engages.

4. A processing unit as set forth in claim 3,
   wherein the engaging portion has a convex shape projecting in a horizontal direction,
   wherein an opening in which the engaging portion is vertically movable is provided in the lid body,
   wherein the engaged portion has a convex shape projecting horizontally into the opening, and
   wherein the hanging supporting member is formed so that engagement of the engaging portion with the engaged portion is released when the lid body is lowered and the processing room is formed.

5. A processing unit as set forth in claim 3,
   wherein an exhaust pip for exhausting an atmosphere in an opening is provided.

6. A processing unit as set forth in claim 1,
   wherein a hole for moving a raising and lowering pin for raising and lowering the substrate therethrough is provided in the mounting table, and
   wherein the hole is provided at a position corresponding to an outer edge portion of the substrate on the mounting table.

7. A processing unit as set forth in claim 6,
   wherein an arm portion for supporting the outer edge portion of the substrate is provided, and
   wherein the arm portion is provided with a notch so as not to interfere with the raising and lowering pin.

8. A processing unit as set forth in claim 1,
   wherein a material for said current plate is a high-density polyethylene or quartz.

9. A processing unit as set forth in claim 1,
   wherein a material for said current plate is a material having porosity.

10. A processing unit as set forth in claim 9,
    wherein said current plate has a shape in which a central portion thereof is thick and a peripheral edge portion thereof is thin.

11. A processing unit as set forth in claim 9,
    wherein said current plate is rotatable.

12. A processing unit for processing a substrate, comprising:
    a chamber for housing the substrate and forming a hermetically closeable processing room;
    an exhauster for exhausting an atmosphere in the processing room from an upper portion of the chamber to reduce a pressure in the processing room; and
    a current plate for controlling an atmospheric current formed in the processing room when the pressure is reduced,
    wherein said chamber includes a mounting table for mounting the substrate thereon, an almost cylindrical lid body with its lower face open for covering the substrate on the mounting plate from above an forming the processing room integrally with the mounting table, and a supporting member for supporting said current plate in such a manner that said current plate is parallel to the mounting plate,
    wherein a raising and lowering mechanism for raising and lowering the lid body is provided,
    wherein a projecting portion is provided on an inner side portion of the lid body, and
    wherein an outer edge portion of said current plate is allowed to be supported on the projecting portion.

13. A processing unit for processing a substrate, comprising:
    a chamber for housing the substrate and forming a hermetically closeable processing room;
    an exhauster for exhausting an atmosphere in the processing room from an upper portion of the chamber to reduce a pressure in the processing room; and
    a current plate for controlling an atmospheric current formed in the processing room when the pressure is reduced,
    wherein said chamber includes a mounting table for mounting the substrate thereon, an almost cylindrical lid body with its lower face open for covering the substrate on the mounting plate from above and forming the processing room integrally with the mounting table, and a supporting member for supporting said current plate in such a manner that said current plate is parallel to the mounting plate,
    wherein a recessed portion for accommodating a lower portion of the supporting member is provided in the mounting table.

14. A processing unit as set forth in claim 13,
    wherein an exhaust pipe for exhausting an atmosphere in the recessed portion is provided.

15. A processing unit for processing a substrate, comprising:
- a chamber for housing the substrate and forming a hermetically closeable processing room;
- an exhauster for exhausting an atmosphere in the processing room from an upper portion of the chamber to reduce a pressure in the processing room; and
- a current plate for controlling an atmospheric current formed in the processing room when the pressure is reduced,
- wherein said chamber includes a mounting table for mounting the substrate thereon, an almost cylindrical lid body with its lower face open for covering the substrate on the mounting plate from above and forming the processing room integrally with the mounting table, and a supporting member for supporting said current plate in such a manner that said current plate is parallel to the mounting plate,
- wherein the supporting member is freely detachable from said current plate.

16. A processing unit as set forth in claim 15,
- wherein said current plate has a closed bottom hole into which the supporting member is freely inserted,
- wherein the closed bottom hole has a stopper urged into the closed bottom hole from an inner peripheral face of the closed bottom hole,
- wherein the stopper a spherical portion at at least a part thereof, and
- wherein an annular an almost V-shaped groove in which the spherical portion of the stopper is put is provided in an outer periphery of the supporting member.

17. A processing unit as set forth in claim 16,
- wherein an elastic member for pressing said current plate in a direction from top to bottom is provided on the lid body.

* * * * *